United States Patent [19]

Stanley

[11] 3,808,545

[45] Apr. 30, 1974

[54] HIGH POWER BRIDGE AUDIO AMPLIFIER

[75] Inventor: Gerald R. Stanley, Mishawaka, Ind.

[73] Assignee: International Radio & Electronics Corporation, Elkhart, Ind.

[22] Filed: Oct. 4, 1972

[21] Appl. No.: 294,861

[52] U.S. Cl. ................. 330/30 R, 330/17, 330/30 D
[51] Int. Cl. ................................................ H03f 3/68
[58] Field of Search ............. 330/13, 30 R, 30 D, 17

[56] References Cited

UNITED STATES PATENTS

| | | | |
|---|---|---|---|
| 3,383,613 | 5/1968 | Novak | 330/22 |
| 2,821,639 | 1/1958 | Bright et al. | 330/30 R X |

*Primary Examiner*—Herman Karl Saalbach
*Assistant Examiner*—Lawrence J. Dahl
*Attorney, Agent, or Firm*—Mueller, Aichele & Ptak

[57] ABSTRACT

A high power audio amplifier includes four power amplifier sections connected in a bridge, with the power supply connected to one opposite pair of nodes and the load terminals connected to a second opposite pair of nodes. One of the load terminals may be connected to a ground reference potential and the power supply is floating with reference to ground. First and second drive amplifiers are provided, with each of the drive amplifiers being connected to the two power amplifier sections connected to one load terminal. The input signal to be amplified is applied to one input of the first drive amplifier and a feedback signal from the load terminal which is not connected to ground is connected to the second input thereof. The second drive amplifier receives either the input signal or the signal from the load terminal, and compares the same with the supply potential to balance the bridge. To protect the transistors of the power amplifier sections, the currents in the transistors of the amplifier sections driven by the second drive amplifier are sensed and used to control the first drive amplifier, to thereby protect the transistors in all of the power amplifier sections. Auxiliary protection circuits are provided for the transistors in the power amplifier sections coupled to each drive amplifier.

18 Claims, 5 Drawing Figures

HIGH POWER BRIDGE AUDIO AMPLIFIER

BACKGROUND OF THE INVENTION

There are many applications in which high power audio amplifiers having low distortion are required. For compactness and high reliability, solid state construction is deemed essential. An amplifier which has been highly satisfactory for such applications is described and claimed in my U.S. Pat. No. 3,493,879, which issued Feb. 3, 1970. This amplifier has been found to be highly satisfactory in applications requiring power outputs up to 300 watts but is not adapted for use at power levels of 600 watts and above.

IT has been proposed to provide high power amplifiers in the form of a bridge circuit to obtain maximum voltage swing from a given supply voltage. However, in circuits which have been proposed problems have been encountered in biasing the transistor stages forming the various arms of the bridge. It has been difficult to provide the desired power in circuits which are very stable and free of distortion and phase shift. Also, in order to protect the transistors and prevent burn out, as when the load becomes shorted, complex and expensive current limiter circuits have been required. The protection circuits which have been used have provided objectionable transients when limiting takes place.

SUMMARY OF THE INVENTION

It is an object of the present invention to provide a high power audio amplifier including a plurality of power amplifier sections connected in a bridge having load terminals at opposite nodes, with drive amplifiers for the pairs of sections coupled to each load terminal.

Another object of the invention is to provide a bridge amplifier having a floating power supply and a load with one terminal grounded, with a first drive amplifier for the amplifier sections connected to the second ungrounded load terminal which is driven by the input signal and a feedback signal from the second load terminal, and a second balancing drive amplifier for the amplifier sections connected to the grounded load terminal driven by the signal from the second load terminal and a signal from the power supply.

A further object of the invention is to provide a bridge amplifier for driving a load having one terminal grounded, with the load terminals and the power supply terminals forming two pairs of opposite nodes of the bridge, and with the amplifier sections connected to the grounded load terminal being driven by the output signal of the sections connected to the ungrounded load terminal, and wherein a protection circuit for the amplifier sections connected to the ungrounded load terminal acts to protect the other power amplifier sections as well.

Still another object of the invention is to provide a bridge amplifier with a first pair of amplifier sections coupled to an ungrounded load terminal and a second pair of power amplifier sections coupled to a grounded load terminal, and with a main protection circuit responsive to the current in the second pair of amplifier sections for controlling the drive to the first pair of sections, and with auxiliary current limiting circuits for each pair of amplifier sections which operate at current levels above the levels of the main protection circuit to provide further protection.

A still further object of the invention is to provide a bridge amplifier having power amplifier sections connected to a floating power supply, with pre-driver transistors and transistors of a drive amplifier energized by an auxiliary power supply bootstrapped to the floating power supply to provide a higher voltage, so that the full voltage of the floating power supply is available for the output transistors of the power amplifier sections.

Yet another object of the invention is to provide a power supply for a bridge amplifier which includes a floating main power supply for the power amplifier sections and a bias supply for drive amplifiers, and a control for delaying the main power supply until after the bias supply has been turned on, and for interrupting the main power supply in the event of direct current or subsonic outputs from the amplifier.

A high power bridge amplifier is provided which is particularly adapted for high fidelity audio amplifier applications, including four power amplifier sections each having a pre-driver transistor, a drive transistor which supplies the load at low signal levels, and a plurality of power output transistors controlled by the driver transistor for driving the load at high signal levels. The amplifier sections are connected in a bridge with opposite nodes connected to load terminals, one of which is at ground potential and the other at a potential with respect to ground which represents the signal output. A power supply provides opposite polarity potentials floating with respect to ground which energizes the bridge at the other opposite pair of nodes. First and second drive amplifiers are provided, each including a solid state operational amplifier coupled to the predriver transistors of the two power amplifier sections which are connected to one load terminal. In one embodiment of the invention, the input signal is applied to both drive amplifiers, with feedback being applied to the drive amplifier for the sections connected to the high potential load terminal from such load terminal, and the second drive amplifier connected to the voltage supply and comparing the input signal with the power supply voltages to drive the amplifier sections connected to ground. In a second embodiment of the invention, the input signal is applied to only the first drive amplifier and the second drive amplifier is driven by the signal from the high potential load terminal, which again is compared with the power supply voltages.

For protecting the transistors of the power amplifier sections in the event of a short circuit or other condition causing excess current through the transistors, the currents in the power amplifier sections connected to the grounded load terminal are sensed and used to control the drive to the amplifier sections which supply current to the output signal potential load terminal. This protects not only the transistors of the power amplifier sections connected to the high potential load terminal, but also the transistors of the power amplifier sections connected to the grounded load terminal and holds the bridge in balance. Further protection may be provided for each pair of power amplifier sections by auxiliary limiter circuits which operate independently for each pair of sections and reduce the drive to the sections. The auxiliary circuits are actuated at current values slightly above the values which cause the main protection circuit to operate, and come into operation only if the main protection circuit fails, or some other unusual circumstance occurs.

The power supply for the amplifier includes a portion for providing the main floating supply potentials and further portions for providing low voltage bias potentials and supplementary potentials which are bootstrapped on the main supply. A control circuit delays the energization of the main supply potentials until after the bias potentials are established so that any transients produced by turn on of input signal sources do not cause an output. The control circuit also includes a low frequency detector to respond to direct current or subaudible outputs of the amplifier to turn off the main power supply to prevent damage to fragile loads. Certain pre-driver transistors and transistors of the drive amplifiers are energized from the supplementary potentials, so that these transistors are not saturated until after the output transistors are saturated, to thereby provide the full voltage swing across the load.

DETAILED DESCRIPTION

Figure 1:
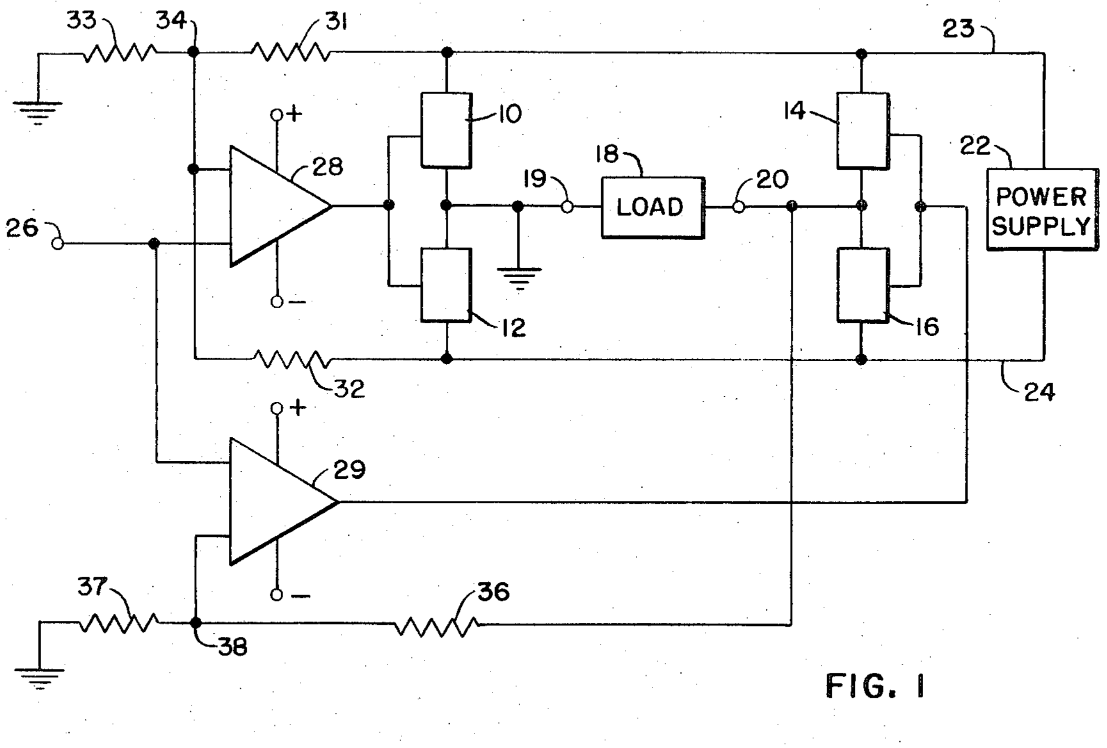
FIG. 1 is a block diagram of a bridge amplifier in accordance with one embodiment of the invention.

FIG. 1 is a block diagram of the high power bridge amplifier which includes power amplifier sections 10, 12, 14 and 16 for driving the load 18. The load 18 has one terminal 19 which is grounded and a second terminal 20 which is at the signal output potential. The power supply 22 provides a positive potential on conductor 23 and a negative potential on conductor 24. The power supply 22 is floating with respect to ground. The load terminals 19 and 20 form one pair of opposite nodes for the bridge, and the power supply conductors 23 and 24 are connected to terminals which form the other opposite nodes, with the amplifier sections 10, 12, 14 and 16 being connected thereto.

An input signal applied at terminal 26 is applied to one input of drive amplifier 28 and one input of drive amplifier 29. These drive amplifiers each have two inputs and terminals for applying biasing potentials. The supply potentials on conductors 23 and 24 are applied to the network including resistors 31, 32 and 33, to provide a potential at point 34 which is connected to the second input of the drive amplifier 28. A feedback circuit including resistors 36 and 37 connected from output terminal 20, provides a potential at the junction 38 which is applied to the second input of amplifier 29. The drive amplifier 28 drives the power amplifier sections 10 and 12, both of which are connected to the grounded output terminal 19, and the drive amplifier 29 drives the power amplifier sections 14 and 16, both of which are connected to the output terminal 20. This simplifies the biasing of the amplifier stages, as will be more fully set forth.

Figure 2:
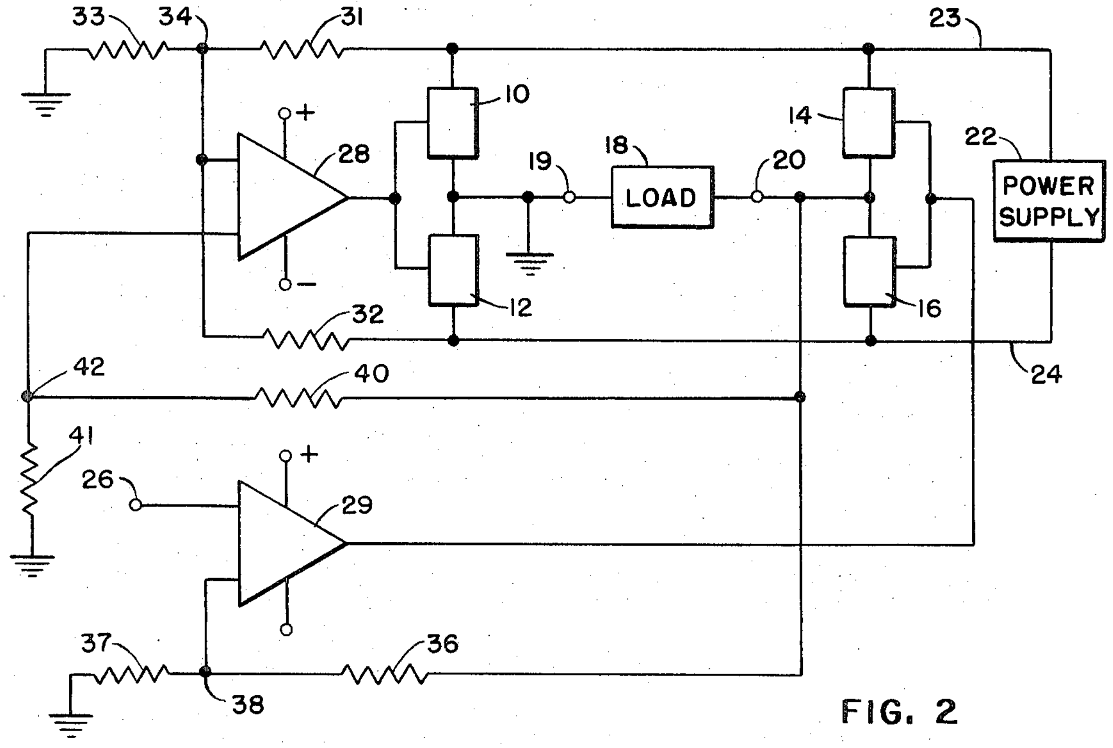
FIG. 2 is a block diagram of a bridge amplifier in accordance with a second embodiment of the invention.

The bridge amplifier shown by the block diagram of FIG. 2 is similar to the amplifier of FIG. 1, and like components are given the same reference numbers. The primary difference is that the input signal is applied only to drive amplifier 29, whereas in FIG. 1 the input signal is applied to both drive amplifiers. Instead of coupling the input signal to amplifier 28, the output signal from terminal 20 is applied through resistors 40 and 41, with the junction 42 thereof connected to the drive amplifier 28. Accordingly, the input to drive amplifier 28 is controlled by the signal in drive amplifier 29 and the power amplifier sections 14 and 16. The use of the arrangement of FIG. 2 has the advantage that by controlling the drive of amplifier 29, to thereby control the signal at output terminal 20, the drive to amplifier 28 is simultaneously controlled. Accordingly, a single protection circuit operating on drive amplifier 29 is effective to protect the output transistors in all of the power amplifier sections 10, 12, 14 and 16, as will be fully described.

Figure 3A:
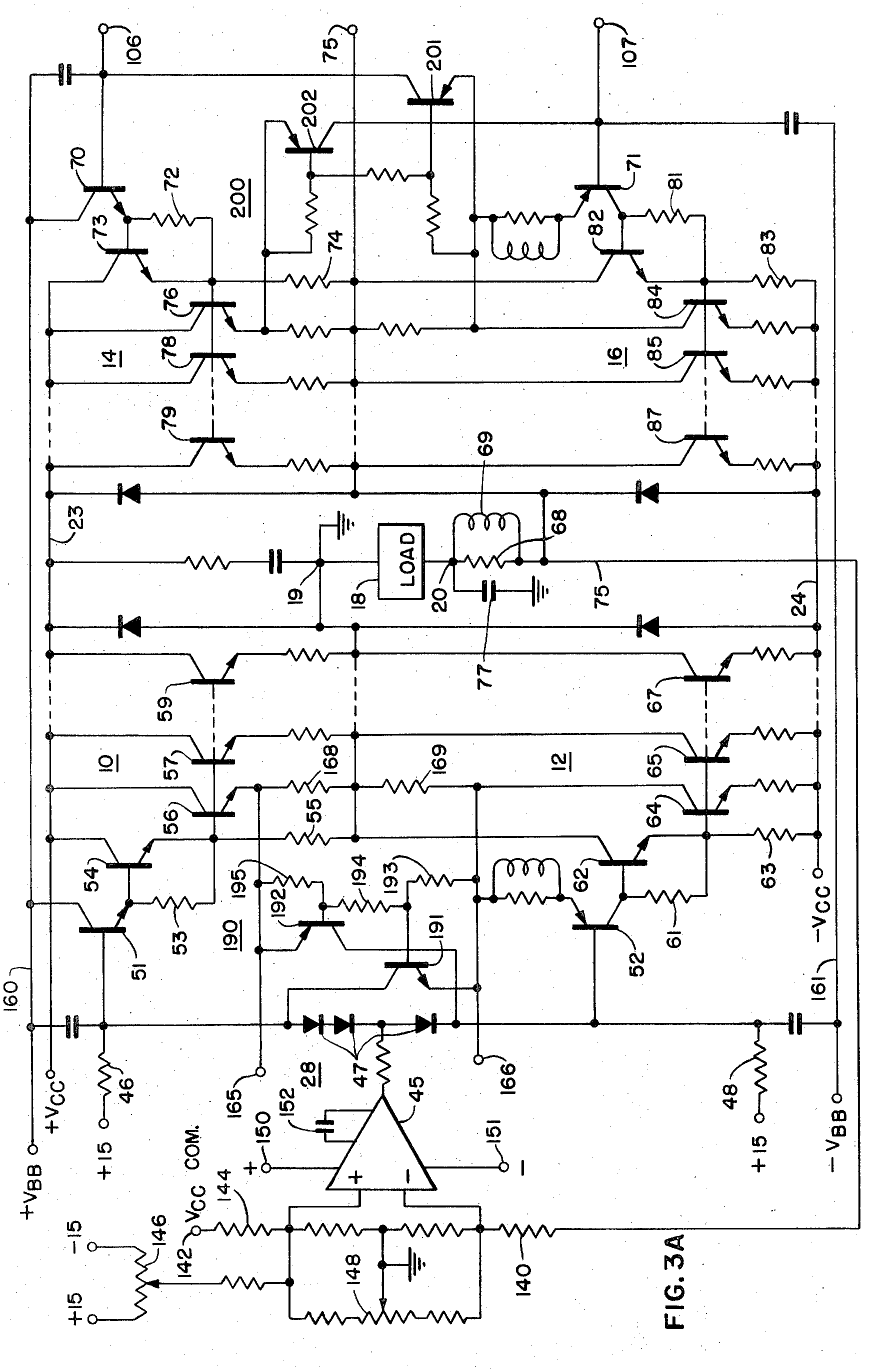
FIGS. 3A and 3B together form a circuit diagram of the bridge amplifier of FIG. 2.
Figure 3B:
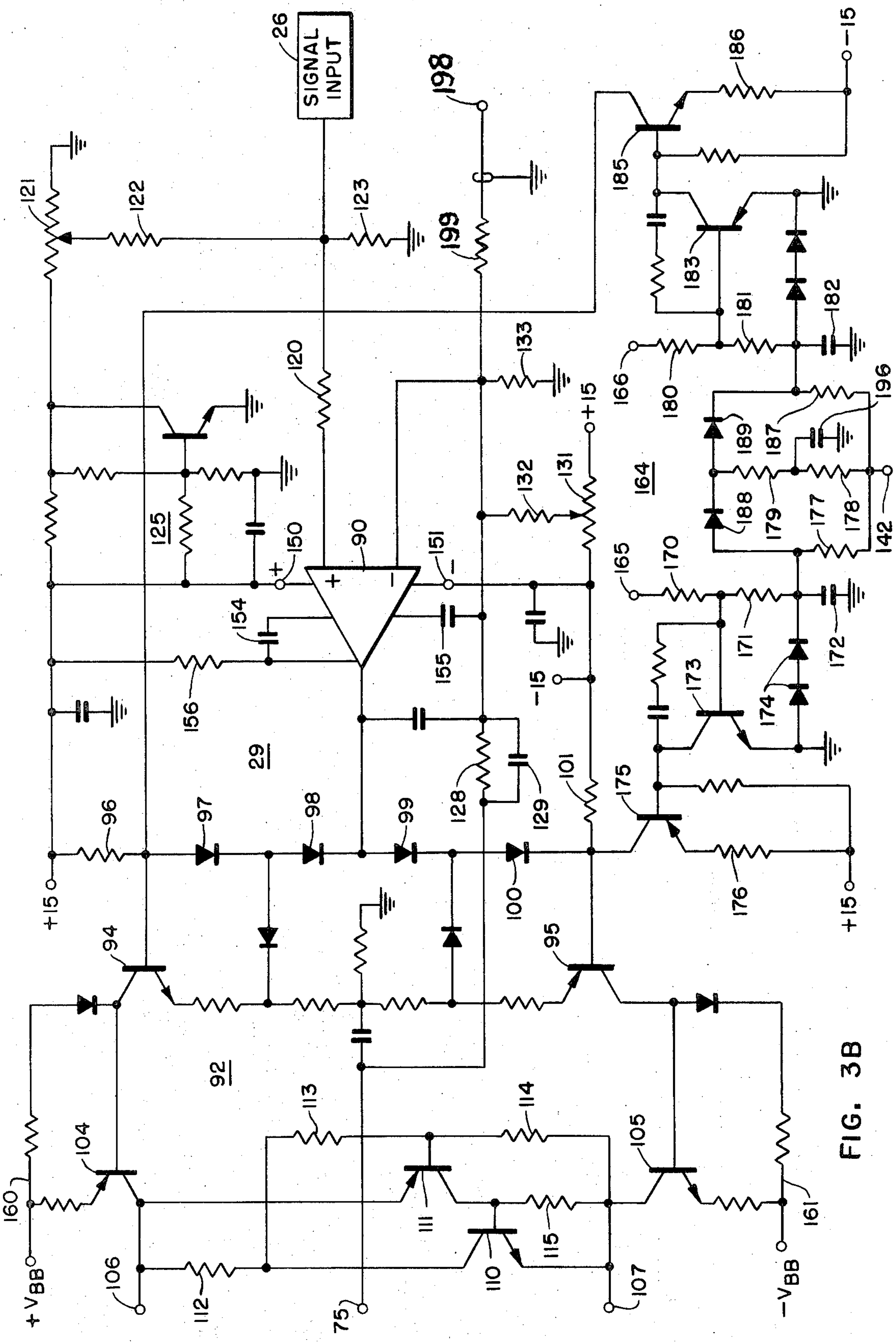

FIGS. 3A and 3B taken together form a circuit diagram of the bridge amplifier shown by the block diagram of FIG. 2. The drive amplifier 28 in FIG. 2 is formed in FIG. 3A by the integrated circuit operational amplifier 45. The signal from amplifier 45 is coupled to the base electrodes of pre-driver transisors 51 and 52 through a voltage divider connected between the +15 and −15 bias potential terminals, and including resistor 46, diodes 47 and resistor 48. The diodes 47 provide a shift or offset in the voltages applied to the bases of transistors 51 and 52, as is well known. The pre-driver transistors 51 and 52 are of opposite conductivity types, so that the signals at the emitter of transistor 51 and at the collector of transistor 52 are effectively in push-pull.

The transistor 51 is of NPN type and controls the current through resistor 53, the voltage across which controls driver transistor 54. Pre-driver transistor 51, driver transistor 54 and output transistors 56, 57 and 59 form the power amplifier section 10 of FIG. 2. The driver transistor 54 controls conduction from the supply conductor 23 to the output terminal 19, to provide the output signal at small signal levels. At large signal levels the current through transistor 54 develops a voltage across resistor 55 which causes the output transistors 56, 57 and 59 to conduct. These three transistors are representative of any desired number of output transistors which may be used, as indicated by the dotted line between the transistors 57 and 59. The operation of the driver transistor 54 and the output transistors 56, 57 and 59 is described in my prior patent referred to above.

On the lower side of the bridge circuit of FIG. 3A, the PNP pre-driver transistor 52 operates to control the current through resistor 61, which is connected between the base and emitter of driver transistor 62. The driver transistor couples supply conductor 24 through resistor 63 to the output terminal 19, and supplies the load at low signal levels. When the signal level increases, the current through transistor 62 provides a voltage across resistor 63 which renders the output transistors 64, 65 and 67 conducting. Again, a greater number of transistors may be provided as required to supply the load current. The driver transistor 62 and the output transistors 64, 65 and 67 operate in the same manner as driver transistor 54 and output transistors 56, 57 and 59. The circuit including pre-driver transistor 52, driver transistor 62 and output transistors 64, 65 and 67 form the power amplifier section 12.

On the other side of the bridge, the pre-driver transistor 70 is of the NPN type and pre-driver transistor 71 is of the PNP type. Transistor 70 provides current through resistor 72 which controls the conductivity of driver transistor 73, which is connected in series with resistor 74 from supply conductor 23 to load conductor 75. The pre-driver transistor 70, driver transistor 73 and output transistors 76, 78 and 79 form the power amplifier section 14 of FIG. 2. The load conductor 75 is connected to the high potential load terminal 20 by resistor 68 and inductor 69, with the load terminal 20 being bypassed by capacitor 77. Transistor 73 will provide the entire load current at low signal levels, and when the signal level increases, the current through resistor 74 will provide a voltage thereacross which renders transistors 76, 78 and 79 conducting. These transistors will the supply the load current in the same manner as the amplifier sections on the left side of the bridge circuit. Additional transistors may be provided if required to provide the load current.

The PNP pre-driver transistor 71 controls the current in resistor 81, which controls the conductivity of driver transistor 82. This transistor supplies current from supply conductor 24 through resistor 83 to conductor 75, which is connected to load terminal 20. When the level of the signal reaches a given value, the voltage across resistor 83 will render transistor 84, 85 and 87 conducting to supply the load current. Additional transistors may be provided as required to satisfy the load current. The circuit including pre-driver transistor 71, driver transistor 82 and output transistors 84, 85, and 87 form the power amplifier section 16.

Referring now to FIG. 3B, the drive amplifier 29 includes integrated circuit operational amplifier 90, which may be identical to the integrated circuit amplifier 45 of FIG. 3A. These two integrated circuit amplifiers may be provided in the same package and may be of known commercial construction. For example, integrated circuit operational amplifier Model $\mu$A739 provided by Fairchild Camera and Instrument Corporation may be used.

In order to provide the drive voltage required for the power amplifier sections 14, 16, the operational amplifier 90 is connected to a translating circuit 92 which increases the level of the drive signal. This includes the transistors 94 and 95 which are of the NPN and PNP types, respectively. The signal from operational amplifier 90 is applied to the base electrodes of the transistors 94 and 95 through a voltage shifting circuit including resistor 96, diodes 97, 98, 99 and 100 and resistor 101, which is connected between the +15 and −15 bias voltage terminals. The voltages applied to the base electrodes of transistors 94 and 95 are therefore offset DC wise, as is well known. NPN transistor 94 controls PNP transistor 104, the collector of which is connected by conductor 106 to the base of transistor 70 in the circuit of FIG. 3A. Similarly, PNP transistor 95 controls NPN transistor 105, the collector of which is connected by conductor 107 to the base of transistor 71 in the circuit of FIG. 3A.

The voltage offset between conductors 106 and 107 is very accurately and reliably controlled by the regenerative circuit including transistors 110 and 111. Transistor 110 has its emitter and collector electrodes connected in series with resistor 112, so that the voltage across resistor 112 is controlled by the conductivity of transistor 110. Resistor 112 is connected in series with resistors 113 and 114 to control the potential applied to the base of transistor 111. Transistor 111 has its emitter and collector electrodes connected in series with resistor 115, which is connected between the base and emitter electrodes of transistor 110 to complete the regenerative path. This circuit provides a very reliable voltage offset between conductors 106 and 107, which is independent of the current therethrough. This makes it possible to operate from an unregulated supply.

The input signal from input terminal 26 (FIG. 3B) is applied through resistor 120 to one input of the operational amplifier 90. Bias is applied to this input from potentiometer 121, the movable contact of which is connected through resistors 122 and 123 to ground. The intermediate point between resistors 122 and 123 is connected by resistor 120 to the input of amplifier 90. Potentiometer 121 is connected to the +15 volt bias supply through a temperature compensated circuit 125. The output signal on output conductor 75 is applied to the second input of operational amplifier 90 through the coupling circuit including resistor 128 and capacitor 129. This applies feedback to the amplifier 90 from the output terminal 20 which is not connected to ground. Bias potential is applied to this input terminal from potentiometer 131, which is connected between the +15 and −15 volt bias supply through resistors 132 and 133 to ground.

The input to the operational amplifier 45 of FIG. 3A is from the output conductor 75 through resistor 140 to one input of the operational amplifier. The potential from terminal 142, which is the common conductor to which the supply potentials on lines 23 and 24 are referenced, is applied through resistor 144 to the second input terminal of operational amplifier 45. The potentiometer 146 connected between the +15 and −15 volt supply provides a static balance potential to the amplifier 45, and the resistive network including potentiometer 148, having its movable contact connected to ground, provides dynamic balance for the amplifier 45.

As shown in FIG. 3B, the +15 volt bias voltage is applied to bias terminal 150 of operational amplifier 90 and the −15 volt bias voltage is applied to terminal 151. These terminals may be common to amplifiers 90 and 45 which, as previously stated, may be in a single package. In order to provide frequency compensation of the operational amplifiers capacitor 152 is connected to amplifier 45, and capacitors 154 and 155 are connected to amplifier 90. The +15 volt bias voltage is applied through resistor 156 to a terminal of operational amplifier 90 to which one side of capacitor 154 is connected, and the capacitor 155 is connected between one input terminal of the amplifier and an auxiliary terminal thereof. The use of the compensating capacitors with the operational amplifier is well known in the art.

As previously stated, a floating power supply is provided which provides a positive potential on conductor 23 and a negative potential on conductor 24, to which the power amplifier sections are connected. A common power supply conductor to which the positive and negative potentials are referenced has also been identified as terminal 142. The potential at terminal 142 is substantially midway between the potentials on conductors 23 and 24.

A higher potential than that on conductors 23 and 24 is also provided which is applied to conductors 160 and 161 of FIGS. 3A and 3B. The pre-driver transistors of amplifier sections 10 and 14 are energized by this potential. That is, transistor 51 coupled to operational amplifier 45 is energized from the positive potential on conductor 160. Likewise, pre-driver transistor 70 of power amplifier section 14 on the opposite side of the bridge, is energized by the potential on conductor 160. The translation circuit 92 of FIG. 3B is also energized by the higher supply potential on conductors 160 and 161, with transistors 94 and 104 being energized from conductor 160, and transistors 95 and 105 being energized from conductor 161. The higher voltages on conductors 160 and 161 allow the transistors energized therefrom to reach saturation after the transistors in the power amplifier sections are saturated. This allows the full output voltage of the main supply to be applied to the load to provide maximum power output. The higher voltages on conductors 160 and 161 may be provided by auxiliary windings on the power supply, which are bootstrapped to the main power supply output terminals, as will be fully explained.

The circuit of the bridge amplifier of FIGS. 3A and 3B which has been described, although illustrated in the configuration shown in FIG. 2, is also applicable to the configuration of FIG. 1. With respect to the circuit which has been described, the only difference between the two configurations is that the input to operational amplifier 45 of drive amplifier 28 is shown connected to the output conductor 75, whereas to provide the configuration of FIG. 1 the operational amplifier 45 will be connected instead to the input signal terminal 26.

In order to protect the transistors of the power amplifier sections 10, 12, 14 and 16 so that these transistors do not burn out, a protection circuit 164 is provided, which is shown in FIG. 3B. This protection circuit is coupled to terminals 165 and 166 of FIG. 3A, which are connected to the junction between the emitter of transistor 56 and resistor 168, and the junction between resistor 169 and the collector of transistor 64, respectively. The voltages at terminals 165 and 166 are measures of the currents through transistors 56 and 64 by the voltages thereacross, and these currents and voltages are essentially the same as for the other parallel connected output transistors of power amplifier sections 10 and 12.

The voltage at terminal 165 (FIG. 3B) is applied across resistors 170 and 171 and capacitor 172, in series to ground. The capacitor 172 will be charged by the current through the circuit, and the voltage developed across resistor 171 and capacitor 172 is applied across the base-emitter junction of transistor 173 to control the conductivity thereof. A pair of diodes 174 are connected across the capacitor 172 so that it can be counter-charged only to a voltage equal to the two diode drops. When the voltage at terminal 165 persists long enough for capacitor 172 to charge so that transistor 173 conducts, the collector potential thereof is brought toward ground. This collector is connected to the base of transistor 175 and renders the ssame conducting to connect the base of transistor 95 through resistor 176 to the +15 bias potential. This reduces the drive applied through transistors 95 and 105 to the amplifier section 16 (FIG. 3A). Reduction of the drive to the amplifier section 16 reduces the output on conductor 75, and since the operational amplifier 45 is driven from conductor 75, this action also reduces the drive to the power amplifier section 10, which will be conducting in the bridge circuit at the same time as power amplifier section 16.

The capacitor 172 is also connected through resistor 177 to terminal 142, and through resistors 178 and 179 in series with diode 188 to terminal 142, which is the common potential for the floating power supply for the amplifier sections 10, 12, 14 and 16. The potential at terminal 142, which is one half the output signal potential applied to the load, causes charging or counter-charging of capacitor 172. The action of the potential at terminal 142 through resistor 177, which is relatively large, provides a slow uniform change in the voltage on capacitor 172. The action on capacitor 172 through resistors 178 and 179 and diode 188, which presents a lower impedance when diode 188 conducts, provides a greater change, but the capacitor 196 which is connected to the junction of resistors 178 and 179 provides a high frequency bypass, so that this circuit does not respond to high frequencies.

The potential applied at terminal 165 causes capacitor 172 to charge to increase the potential thereacross and increase the potential applied to the base of transistor 173. If the potential across transistor 56 of amplifier section 10 increases (relative to the quiescent potential), the potential applied at terminal 165 charges capacitor 172, increasing the potential applied to the base of transistor 173, giving increased protection (limiting at a reduced value of current) to transistor 56. If the potential across transistor 56 decreases, the converse occurs and capacitor 172 is counter-charged giving reduced protection of transistor 56. The transistor 56, as well as the other transistors of amplifier sections 10 and 16, are therefore protected from damage by excessive voltages and currents.

The other side of the protection circuit operates in exactly the same way so that current through the output transistor 64 and through resistor 169 will be sensed at terminal 166, and will be applied across resistors 180 and 181 and capacitor 182 (FIG. 3B) to control the conductivity of transistor 183. When the voltage across capacitor 182 reaches a value so that transistor 183 conducts, this will cause the collector thereof to be brought toward ground potential. This collector is connected to the base of transistor 185 to in turn render this transistor conducting to connect the base of transistor 94 to the −15 bias potential through resistor 186. This reduces the drive applied through transistors 94 and 104 to the power amplifier section 14. This will again reduce the output on conductor 75 to reduce the drive to operational amplifier 45, and thereby reduce the current in the power amplifier section 12. This operation will effectively protect the transistors in all the power amplifier sections, and this is accomplished without unbalancing the bridge.

The protection circuit 164 functions as an automatic continuously variable current limiter at audio frequencies, with the current limiting threshold decreasing with output current and increasing with output voltage. The no signal threshold is high enough to allow bursts of tone without premature limiting. The limiter has no instantaneous response to output voltage so that flyback transients do not appear in the output when limiting occurs on inductive loads. The protection circuit operates when the excessive current continues for a given time and then operates in accordance with the history of the output signal.

In addition to the main protection circuit 164, auxiliary protection or current limiter circuits are provided which can operate to protect the amplifier sections coupled to each drive amplifier. Protection circuit 190 (FIG. 3A) protects power amplifier sections 10 and 12, and protection circuit 200 protects power amplifier sections 14 and 16.

The protection or current limiter circuit 190 includes transistor 191 which shunts the drive to transistor 51, and transistor 192 which shunts the drive to transistor 52. The voltage sensed by conductor 166 is applied partially across resistor 193 to the base of transistor 191, and through resistors 193 and 194 to the base of transistor 192, so that both shunting transistors are controlled by the potential on conductor 166. Similarly, the potential on conductor 165 is applied partially across resistor 195 to the base of transistor 192, and through resistors 195 and 194 to the base of transistor 191. When both conductors 165 and 166 indicate excessive current, the potentials on both are applied to transistor 191 and to transistor 192. This circuit arrangement provides high sensitivity to common mode current, essentially double that provided by controlling each transistor only from one sense resistor from one side or arm of the bridge. The sensitivity of current developed in only one side is retained.

The current limiter circuit 200 is essentially the same as the current limiter circuit 190 and includes transistor 201 for limiting the drive to transistor 70, and transistor 202 for limiting the drive to transistor 71. These are connected to sense resistors connected in series with the transistor 75 of amplifier section 14 and transistor 84 of amplifier section 16.

The transistor protection circuits 190 and 200 can be used in an amplifier having the drive amplifiers connected as shown in FIG. 1, as well as the amplifier configuration shown in FIG. 2, which is illustrated in detail by FIGS. 3A and 3B. However, the main protection circuit 164 shown in FIG. 3B would not be effective to protect the power transistors of all of the power amplifier sections when the drive is applied as shown in FIG. 1, since the drive to amplifier 28 is not applied from the output of amplifier sections 14 and 16 which are controlled by the main protection circuit.

Figure 4:
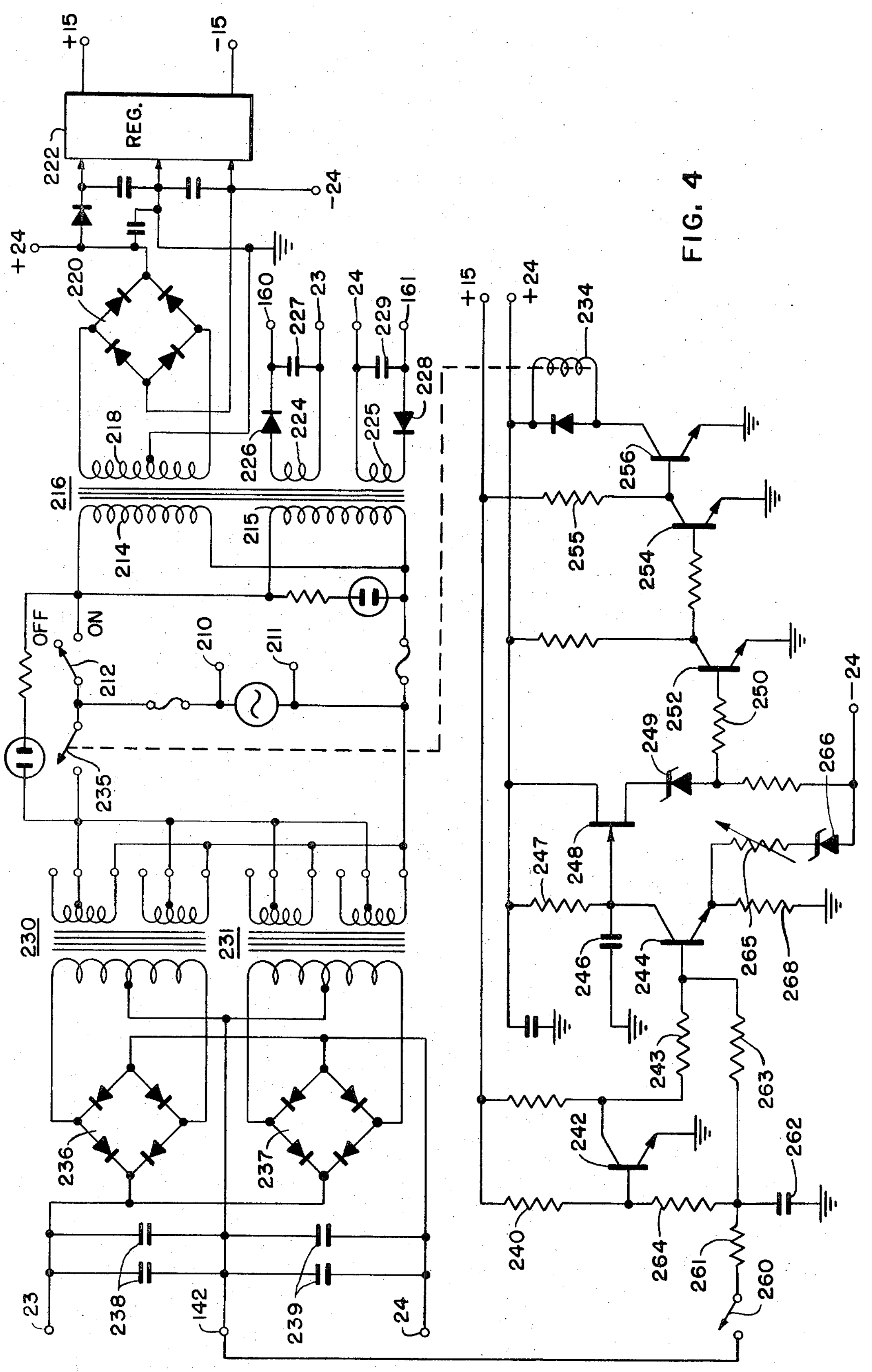
FIG. 4 is a circuit diagram of the power supply for the amplifier of FIG. 2.

FIG. 4 is the circuit diagram of the power supply for the amplifier of FIGS. 3A and 3B. The power supply has input terminals 210 and 211 for connection to a standard 60 cycle supply. The supply is connected through switch 212 to the primary windings 214 and 215 of transformer 216. A secondary winding 218 feeds a full wave bridge rectifier 220 which provides +24 and −24 volt potentials. These potentials are applied to regulator 222 which provides regulated +15 and −15 volt bias potentials. The regulator 222 may be of any standard construction. The +15 and −15 bias potentials are used to energize the operational amplifiers 45 and 90 shown in FIGS. 3A and 3B, and to provide other bias potentials. The transformer 216 also includes secondary windings 224 and 225 which provide the supplementary potentials bootstrapped on the main supply. The voltage from winding 224 is rectified by diode 226 and filtered by capacitor 227 and connected between supply conductor 23 and the higher voltage conductor 160. Similarly, the voltage from winding 225 is rectified by diode 228 and filtered by capacitor 229 and applied between the supply conductor 24 and the higher voltage conductor 161. As previously stated, these auxiliary potentials are bootstrapped to the main floating supply potential.

The power supply includes main power transformers 230 and 231, each having a plurality of primary windings connected in parallel and energized through contacts 235. Contacts 235 may be relay contacts energized by coil 234. When the relay operates, the alternating current supply is coupled to the primary windings of transformers 230 and 231, which provide the desired voltage levels to the full wave bridge rectifiers 236 and 237. These two bridge rectifiers are connected in parallel and provide the current required at the main supply potentials provided by conductors 23 and 24. The secondary windings of transformers 230 and 231 have center taps which are connected to point 142 which forms the common terminal for the floating supply. Capacitors 238 connected between conductors 23 and 142, and capacitors 239 connected between conductors 24 and 142, provide the required filtering of the supply potentials. For use with an amplifier providing 600 watts at 8 ohms, the potentials on conductors 23 and 24 may be +60 volts and −60 volts, respectively. The higher potentials on conductors 160 and 161 may be 2 or 3 volts greater than the supply potentials on conductors 23 and 24.

It is desired that the energization of the main supply conductors be delayed after bias potentials are provided. This permits the bias potentials to energize the operational amplifiers before the output sections are operative, so that any transients resulting from turn on of the operational amplifiers or input sources are not reproduced as sounds in loudspeakers connected to the amplifier. This is accomplished by the time delay circuit shown at the bottom of FIG. 4. When switch 212 is operated, the 24 volt potentials are provided by bridge 220, and the 15 volt potentials are provided by regulator 222. The +15 volts is applied through resistor 240 to the base of transistor 242 to turn this transistor on. This will ground the collector of transistor 242 to reduce the potential applied through resistor 243 to the base of transistor 244, to turn this transistor off. With transistor 244 off, capacitor 246 can charge through resistor 247 from the +24 volt potential. Capacitor 246 is connected to the gate of field effect transistor 248, and the positive voltage developed across capacitor 246 after a predetermined time will render transistor 248 conducting. This will provide a positive potential through zener diode 249 and resistor 250 to the base of transistor 252 to turn this transistor on. Transistor 252, when conducting, will provide a ground to the base of transistor 254 to turn off this transistor. With transistor 254 off, resistor 255 will apply a positive potential to the base of transistor 256 to turn it on. This will energize the relay coil 234 so that the relay contacts 235 will close to supply power to the main transformers 230 and 231 and result in the supply potentials on conductors 23 and 24. Accordingly, the supply potentials on conductors 23 and 24 will be delayed with respect to the +15 and −15 volt bias potentials, with the amount of delay depending upon the time required to charge capacitor 246 to render the field effect transistor 248 conducting.

The time delay circuit also functions as a control circuit for turning off the main power supply in the event that the amplifier produces a large direct current or subsonic output which might damage the load, such as a fragile loudspeaker. For such operation the switch 260 connects the common power supply conductor 142 through resistor 261 to capacitor 262 to charge the same from the DC or subsonic voltage which is developed on conductor 142, as the power supply potentials swing with the signal. This voltage is applied through resistor 263 to the base of transistor 244 to turn on this transistor. Resistor 243 isolates the base of transistor 244 from the grounded collector of transistor 242 to permit this operation. If capacitor 262 is countercharged from a voltage on conductor 142, transistor 242 will be turned off by the voltage fed through resistor 264. The result of turning off transistor 242 is to turn on transistor 244. Resistor 263 now serves to isolate the base of transistor 244 from the voltage on capacitor 262.

Transistor 244 grounds capacitor 246 to turn off the field effect transistor 248, which operates through the transistors 252, 254 and 256 to energize the relay winding 234. The capacitor 262 is selected so that it will not have a substantial impedance at frequencies above 10Hz so that the turn off circuit will reset the power supply only in response to direct current or very low frequency signals. Accordingly, the relay 234 will release to open contacts 235 to disconnect the transformers 230 and 231 and remove the potential from supply conductors 23 and 24. Variable resistors 265, connected in series with zener diode 266 from the −24 volt potential to the emitter of transistor 244, and through resistor 268 to ground, is adjustable to set the threshold for the high line voltage detector to provide similar means supply shutdown.

Since one output terminal of the bridge amplifier is connected to ground, it is possible to couple two amplifiers together to provide double the output power. Such coupling can be provided by coupling the ungrounded output or load terminal 20 of a first amplifier to input terminal 198 (FIG. 3B) of a second amplifier. This terminal is coupled through resistor 199 to the second (lower) input to operational amplifier 90. For such operation, the upper input terminal (to which resistor 120 is connected) is connected to ground. The second amplifier provides unity gain with an inverted output, so that the output signals of the two amplifiers add to provide twice as much output signal power.

The high power bridge amplifier of the invention has been found to be highly satisfactory for use as an audio amplifier. The protection circuits described are effective to protect the transistors of the amplifier without causing unbalance of the bridge or undesired response characteristics. The amplifier also eliminates objectionable noises resulting from input sources, and is suitable for use with fragile loads.

I claim:

1. A bridge audio amplifier circuit including in combination:

first, second, third and fourth power amplifier sections, first and second load terminals, one of which is connected to a reference potential, power supply means including first and second supply terminals providing voltages of opposite polarities floating with respect to the reference potential, means connecting said amplifier sections to said power supply means and to said load terminals to form a bridge circuit, with said first and second supply terminals forming one opposite pair of nodes and said first and second load terminals forming a second opposite pair of nodes, and drive means for said amplifier sections including first and second drive amplifiers, and coupling means direct current coupling said first drive amplifier to said power amplifier sections connected to said first load terminal and direct current coupling said second drive amplifier to said power amplifier sections connected to said second load terminal, said coupling means applying signals to said power amplifier sections to cause the same to operate in a balanced manner to provide a high fidelity audio output at said load terminals.

2. A bridge amplifier circuit in accordance with claim 1 wherein said first and second drive amplifiers each includes an operational amplifier having two inputs, signal input means connected to one input of each of said drive amplifiers, feedback means connected from said load terminal which is not connected to a reference potential to the other input of said first drive amplifier for applying signals from said load terminal to said other input, and means connecting said power supply means to the other input of said second drive amplifier.

3. A bridge amplifier circuit in accordance with claim 1 wherein at least one of said power amplifier sections includes a pre-driver transistor, and including supplementary power supply means coupled to said transistor and providing a voltage therefor greater than the voltages at said supply terminals.

4. A bridge amplifier circuit in accordance with claim 1 wherein said power amplifier sections coupled to each of said first and second drive amplifiers include a pair of complementary pre-driver transistors providing push-pull outputs.

5. A bridge amplifier circuit in accordance with claim 1 wherein said first and second drive amplifiers each includes an operational amplifier, and wherein said power supply means includes a first portion connected to said first and second supply terminals for providing operating voltages to said power amplifier sections and a second portion connected to said operational amplifiers for providing operating voltages therefor, and control means for causing said second portion of said power supply means to be operative before said first portion thereof is operative so that said operational amplifiers are rendered operative before said power amplifier sections are energized by said first and second supply terminals.

6. A bridge amplifier circuit in accordance with claim 1 wherein said power supply means has a reference terminal which produces a potential which varies with the output signal, and control means coupled to said reference terminal and responsive to variations in such potential which are below a predetermined frequency for removing the potential from said supply terminals.

7. A bridge amplifier circuit in accordance with claim 1 wherein each of said power amplifier sections includes a pre-driver transistor, a power output transistor coupled to said pre-driver transistor and having output electrodes, and a sense resistor connected in series with said output electrodes, and including current limiter means for said power amplifier sections associated with each drive amplifier, said current limiter means being coupled to said sense resistors of said power amplifier sections and responsive to the voltages developed thereacross, and being connected to said pre-driver transistors of said power amplifier sections for controlling the same to limit the outputs thereof.

8. A bridge amplifier circuit in accordance with claim 7 wherein each of said current limiter means includes a pair of transistors individually coupled to said pre-driver transistors, and including means coupling said sense resistors of both of said amplifier sections coupled to each drive amplifier to each of said transistors of said current limiter means.

9. A bridge amplifier circuit in accordance with claim 8 wherein said transistors of each of said pairs are of complementary type, and each transistor of said current limiter means is of the same type as said pre-driver transistor to which it is coupled, and each of said current limiter means acts to reduce the output of the associated pre-driver transistor when the voltages across the sense resistors coupled thereto reach predetermined threshold values.

10. A bridge amplifier circuit in accordance with claim 1 wherein said first and second drive amplifiers each includes an operational amplifier having two inputs, signal input means connected to one input of said first drive amplifier, feedback circuit means connected from said load terminal not connected to the reference potential to the other input of said first drive amplifier for applying signals from said load terminal to said other input, means connecting said load terminal not connected to the reference potential to one input of said second drive amplifier and means connecting said power supply means to the other input of said second drive amplifier.

11. A bridge amplifier circuit in accordance with claim 10 wherein said amplifier sections coupled to said second drive amplifier each includes an output transistor and a sense resistor connected in series with such output transistor, and including current limiter means coupled to said sense resistors and to said first drive amplifier for controlling the drive of said first drive amplifier in accordance with the voltage across said sense resistors in response to voltages which exceed a predetermined threshold.

12. A bridge amplifier circuit in accordance with claim 10 wherein each of said power amplifier sections coupled to said first drive amplifier includes a pair of pre-driver transistors, and including a translating circuit coupling said operational amplifier to said first drive amplifier to said pre-driver transistors for increasing the level of the signals applied thereto.

13. A bridge amplifier circuit in accordance with claim 12 wherein said amplifier sections coupled to said second drive amplifier each includes an output transistor and a sense resistor connected in series with such output transistors, and said translating circuit includes a pair of transistors, and including current limiting means coupled to said sense resistors and to said transistors of said translating circuit for reducing the level of the signals in such transistors when the voltage across said sense resistors exceeds a predetermined threshold.

14. A bridge rectifier in accordance with claim 12 wherein said translating circuit includes a plurality of transistors, and further including supplementary power supply means having first and second portions bootstrapped to said first and second supply terminals for providing operating voltages greater than the voltages at said supply terminals, and means connecting said supplementary power supply means to said transistors of said translating circuit for providing the greater operating voltages thereto.

15. A bridge amplifier circuit in accordance with claim 10 wherein said power amplifier sections coupled to said first drive amplifier includes pre-driver transistors of complementary types, said pre-driver transistors having base electrodes for receiving signals, and a circuit for establishing a predetermined offset between the voltages of said base electrodes including first and second transistors of complementary types, each having base, emitter and collector electrodes, first, second and third resistors connected in series between said base electrodes of said pre-driver transistors, said emitter and collector electrodes of said first transistor being connected across said second and third resistors, and a fourth resistor connected in series with the emitter and collector electrodes of said second transistors, the common point between said second and third resistors being connected to the base electrode of said second transistor, and said collector of said second transistor being connected to said base of said first transistor.

16. A bridge amplifier circuit in accordance with claim 1 wherein each of said power amplifier sections includes a first transistor having an emitter-collector path connected in series with a resistor between one of said supply terminals and one of said load terminals, and at least one output transistor having base, emitter and collector electrodes, with said base electrode connected to the junction of said collector-emitter path of said first transistor and said resistor, and means connecting said emitter and collector electrodes of said output transistor between said one supply terminal and said one load terminal, with said first transistor of each amplifier section providing the output current to said one load terminal at relatively low signal levels and providing a voltage across said resistor to render said output transistor conducting to provide output current at relatively high signals levels.

17. The bridge amplifier in accordance with claim 16 wherein each of said power amplifier sections includes a plurality of output transistors connected between the associated supply and load terminals which operate in parallel to provide the output current at high signal levels.

18. A bridge amplifier in accordance with claim 1 wherein said first drive amplifier is coupled to said power amplifier sections connected to the load terminal which is connected to the reference potential and said second drive amplifier is connected to the other load terminal, said second drive amplifier including an operational amplifier having first and second inputs, first means coupled to said first input for applying thereto signals to be amplified, and second means coupled to said second input for applying thereto feedback signals from said other load terminal, said second means including a circuit portion for receiving signals and providing a unity gain inverted output at said other load terminal.

* * * * *